United States Patent [19]

Haberern et al.

[11] Patent Number: 5,561,680

[45] Date of Patent: Oct. 1, 1996

[54] II-VI SEMICONDUCTOR DIODE LASER HAVING A STRAINED LAYER

[75] Inventors: Kevin W. Haberern, Hopewell Junction, N.Y.; Ronald R. Drenten, Valkenswaard, Netherlands

[73] Assignee: Philips Electronics North America Corporation, New York, N.Y.

[21] Appl. No.: 359,379

[22] Filed: Dec. 20, 1994

[51] Int. Cl.$^6$ .................................................. H01S 3/19
[52] U.S. Cl. ............................... 372/46; 372/43; 372/45
[58] Field of Search .................................. 372/46, 43, 45

[56] References Cited

U.S. PATENT DOCUMENTS

| | | | |
|---|---|---|---|
| 4,663,761 | 5/1987 | Barnard et al. | 372/45 |
| 4,756,627 | 7/1988 | Nelson | 374/159 |
| 5,379,312 | 1/1995 | Bour et al. | 372/46 |
| 5,406,574 | 4/1995 | Rennie et al. | 372/45 |

OTHER PUBLICATIONS

"Photoelastic Waveguides and their effect on Stripe–Geometry GaAs/Ga$_{1-x}$Al$_x$As Lasers", J. Appl. Phys. 50(7) pp. 4567–4579 Jul. 1979.

"The Stresses and Photoelastic Effects in Stripe Geometry GaAs–GaAlAs DH Lasers with Masked and Selective Thermal Oxidation (MSTO) Structure", IEEE Journal of Quantum Electronics, vol. QE–19, No. 6, Jun. 1983 pp. 1016–1020.

"Photoelastic Effects on the Emission Patterns of InGaAsP Ridge–Waveguide Lasers", IEEE Journal of Quantum Electronics, vol. 25, No. 4, Apr. 1989, pp. 651–661.

"A Novel Electro–Optically Controlled Directional–Coupler Switch in GaAs Epitaxial Layers at 1.15 µm", IEEE Transactions on Electron Devices, vol. ED–19, Sep. 1982, pp. 1477–1483.

"Strain Induced Guided Wave Devices for III–V Semiconductor Opto–Electronic Circuits", IEE Colloquium on 'Towards Semiconductor Integrated Opto–electronics' (Digest No. 29), London, England, 25 Mar. 1985 pp. 2/1–5.

Primary Examiner—Rodney B. Bovernick
Assistant Examiner—Yisun Song
Attorney, Agent, or Firm—Steven R. Biren

[57] ABSTRACT

A II–VI semiconductor diode laser has a strained layer disposed on top of the structure. This strained layer, having a thickness of between about 0.05 microns and 2 microns, is either a single film or a stack of films, preferably of metal. The strain field produced by this layer in the semiconductor layer structure produces a change in the refractive index of the structure, due to the photo-elastic effect. By virtue of this effect a strain-induced waveguide is provided in the diode laser, with a strained layer in an edge, stripe or window structure. Furthermore, a tensely-strained layer covering the entire structure is used to produce a strain field similar to that which occurs when the structure is bent. This strain field will produce strain-enhanced gain in the underlying structure, which allows for operation of the laser at a lower threshold current.

17 Claims, 3 Drawing Sheets

II-VI SEMICONDUCTOR DIODE LASER HAVING A STRAINED LAYER

BACKGROUND OF THE INVENTION

The invention relates to II–VI semiconductor diode lasers, and in particular to II–VI semiconductor diode lasers employing a strained layer to cause strain-induced index guiding and/or strain-enhanced gain.

Presently, most commercially-available semiconductor diode lasers are fabricated of III–V compound semiconductors and their alloys. Such semiconductor diode lasers, which emit light in the infrared and red portions of the spectrum, are used inter alia as components in read and/or write heads of information processing equipment such as laser printers, bar code readers, and read and/or write devices for optical registration carriers such as CD and CD-ROM discs, and as transmitters in systems for optical glass fiber communication. In the latter systems, the semiconductor diode laser may also be used as a light amplifier, and in this application the term "laser" is meant to include such light amplifiers.

However, there are many applications for which the wavelength of light generated by infrared and red diode lasers is not suitable. Other types of semiconductor diode lasers, such as II–VI semiconductor diode lasers which emit light at shorter wavelengths, for example the green and blue portions of the spectrum, would accordingly be desirable. These semiconductor diode lasers would also increase the performance and capabilities of many systems which currently use infrared and red semiconductor diode lasers.

Semiconductor diode lasers consist of semiconductor layers, and require light confinement in two directions in order to operate efficiently. The first direction in which confinement is needed is the vertical direction perpendicular to the semiconductor layers. This confinement is realized by cladding layers spaced above and below the active layer in the laser. Confinement in a second direction, i.e. in the lateral direction parallel to the layers, is also necessary in semiconductor diode lasers. In known II–VI semiconductor diode lasers, this confinement is realized by laterally confining the injection current that gives rise to optical gain. These structures are called "gain-guided" structures. However, this type of confinement is not very efficient. For enhanced lateral confinement, an etching process can be performed on the layer structure in order to form, for example, a ridge structure. The effective refractive index under the ridge is then greater than the effective refractive index alongside it. This difference in refractive indices induces additional lateral confinement. The structures employing this guiding mechanism are called "index-guided" structures. In most cases, the manufacture of these structures require some form of etching of semiconductor material, which is generally not an easy step.

Both of the laser structures described above require an injection current to produce laser light. The minimum current that is needed is called the threshold current. Since a high current will use more power, produce more heat, and will result in a shorter life for the semiconductor diode laser, it is desirable to keep the threshold current as low as possible consistent with reliable operation.

SUMMARY OF THE INVENTION

It is therefore an object of the present invention to provide an index-guided II–VI semiconductor diode laser which can be produced without the need for etching semiconductor layers.

It is a further object of the invention to provide a II–VI semiconductor diode laser having enhanced gain, allowing for a decreased operating current.

These and other objects of the invention are realized in the present invention by a strained layer on top of a II–VI semiconductor structure. The II–VI semiconductor diode lasers according to the invention employ a patterned strained layer, either a single film or stack of films, located on top of the structure to produce a strain field in the semiconductor layers. This strain field gives rise to a change in the refractive index in accordance with the photo-elastic effect. Spatial variations in refractive index as a result of a nonuniform strain field can produce guiding regions, which will laterally confine the light. These photo-elastic waveguides are thus formed by variations of the refractive index in the transverse direction in the II–VI semiconductor laser diode. It should be noted that the photo-elastic effect in II–VI semiconductor diode lasers is stronger than in III–V semiconductor lasers. Though this means that the deposition process must be accurately controlled, it produces a stronger strain-induced lateral confinement in II–VI semiconductor diode lasers than in III–V lasers.

In addition to the use of strain fields to produce strain-induced waveguides, strain fields can also be used in semiconductor diode lasers to produce strain-enhanced gain of the active layer by producing a uniform strain field. This enhanced gain is a result of the strain induced by a tensely-strained layer on the active layer of the II–VI semiconductor laser structure, and allows for lower threshold currents which improve longevity and reduce power consumption of the laser.

Depending on the sign (i.e. compressive or tensile), and the spatial distribution of the strain field, the II–VI semiconductor diode laser will either act as a strain-induced index-guided laser, or as a laser with strain-enhanced gain.

In a first embodiment of the invention, a part of the II–VI semiconductor layer structure is covered by an insulating layer. A (i.e. adhesive) layer is disposed on top of this insulating layer, and extends over it to cover an adjacent stripe of the semiconductor layer structure. The width of this covered adjacent stripe is roughly between 1 micron and 10 microns. A strained layer is deposited over this sticking layer. This strained layer can either be a single film or a stack of films, and is typically between 0.05 microns and 2 microns thick. Preferably this strained layer, and the sticking layer, are made of metal so they can function as an electrode connection to the laser. The strained layer, which can either be under tensile stress or under compressive stress, causes a strain field in the underlying semiconductor layer structure, which induces localized changes in the refractive index. Near the edge of the strained layer, the strain field builds up to its maximum. The strain near this edge causes the refractive index of the semiconductor material to increase. The resulting effective refractive index profile thus has a local maximum near the edge, which provides for the photo-elastic or strain-induced waveguide. The structure in this first embodiment is called an edge structure.

In a second embodiment of the invention, the insulating layer, the sticking layer and the strained layer all have a stripe-shaped opening (window). The structure of this embodiment is called a window structure. The strained layer in this embodiment thus has two edges that are spaced apart by the width of the window. The effective strain field in this embodiment is the superposition of the strain fields caused by each edge of the strained layer. This effective strain field induces a change in the refractive index of the semiconductor layers, resulting in a local maximum of the effective refractive index which provides for the strain-induced waveguide. In this embodiment a separate metal electrode is deposited over the strained layer. This metal electrode extends down into the window to contact the top layer of the II–VI semiconductor layer structure.

In a third embodiment of the invention the sticking layer and the strained layer are applied over the entire underlying structure. A mechanically-soft insulating layer, present between the sticking layer and the II–VI semiconductor layer structure, electrically insulates part of the II–VI semiconductor layer structure and shields the same part of the II–VI semiconductor layer structure from the influence of the strained layer. This mechanically-soft insulating layer has a stripe-shaped opening (window), the width of which is between 1 micron and 10 microns, through which the sticking layer and the strained layer can contact the underlying II–VI semiconductor layer structure. Since it is only through this opening that the strained layer exerts strain on the II–VI semiconductor layer this structure is equivalent to a structure having a free-standing stripe of the same composition (but omitting the need for a mechanically-soft insulating layer). Therefore the structure of this embodiment is called a stripe (equivalent) structure.

In a further embodiment of the invention, the electrical contact layer of the II–VI semiconductor layer structure is ion implanted, except for a stripe-shaped area (stripe). The part of the electrical contact layer that is ion implanted will have a high resistivity, and will function as an insulating layer. On top of the stripe of the electrical contact layer which is not ion implanted, a mechanically-soft metal contact stripe is disposed. Preferably, however, the contact stripe is first disposed, and will subsequently function as a mask for the ion implantation of the contact layer. The sticking layer and the strained layer are again disposed over the entire structure. The strain of the part of the strained layer above the contact stripe will however be absorbed by the contact stripe, and not be conducted to the II–VI semiconductor layer structure. The strain field introduced in the waveguiding layers of the II–VI semiconductor layer structure is thus similar to that of a window structure.

In yet a further embodiment of the invention, the contact stripe of the above embodiment is omitted. The strained layer in this planar surfaced embodiment produces an uniform strain field, which, when a tensely-strained layer is applied on the structure, will enhance the gain of the active layer.

It should be noted that if the sticking layer is also strained, it can be part of the strained layer, and there is thus no need for a separate sticking layer.

It is further noted that additional sticking layers can be used, for example between the II–VI semiconductor layer structure and the insulating layer of the second embodiment, to provide a better adhesive connection between the two.

It is also noted that both the strained layer and the sticking layer are preferably made of metal in embodiments where they can also function as an electrode.

BRIEF DESCRIPTION OF THE DRAWING

The invention may be more completely understood with reference to the following detailed description, to be read in conjunction with the accompanying drawing, in which.

It should be noted that the Figures are not drawn to scale, with certain dimensions being exaggerated for greater clarity. In the Figures, like reference numerals are used to describe like regions.

DESCRIPTION OF THE PREFERRED EMBODIMENTS

Figure 1:
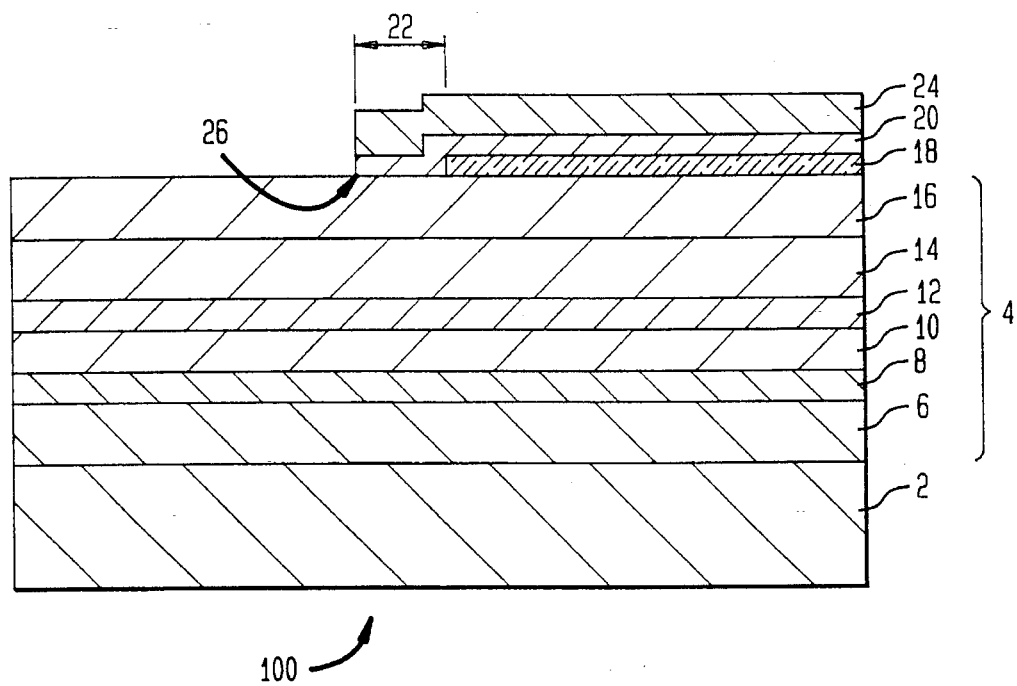
FIG. 1 is a cross-sectional view illustrating a first embodiment of a structure of a II–VI semiconductor diode laser which includes a strained layer in an edge pattern in accordance with the invention.

Turning now to FIG. 1, there is shown a cross-section of a separate confinement double heterostructure (SCDH) II–VI semiconductor diode laser 100 according to a first embodiment of the invention, having a substrate 2 of a first conductivity type, for example a (001) oriented, n-type GaAs (III–V semiconductor material) substrate having a net doping concentration on the order of $10^{18}$ at/cm$^3$. A II–VI semiconductor layer structure 4 is disposed on top of this substrate 2. In FIG. 1, this semiconductor layer structure 4 includes an active layer 10 situated between two waveguiding layers 8, 12 and two cladding layers 6, 14, and a electrical contact layer 16 above the layer 14. The layers 6–16 can be grown epitaxially on the substrate 2 by techniques well known to those skilled in the art, such as MBE or MOCVD. The first cladding layer 6, of II–VI semiconductor material of the same conductivity type as the substrate 2, is disposed atop the substrate 2. This first cladding layer 6 is, for example, an n-type ZnMgSSe layer with a net doping concentration on the order of $10^{17}$ at/cm$^3$. The thickness of this first cladding layer 6 is typically about 2 microns.

The first waveguiding layer 8, of II–VI semiconductor material of the same conductivity type as that of the first cladding layer 6, is disposed atop the first cladding layer 6. The first waveguiding layer 8 is, for example, an n-type ZnSSe layer having a net doping concentration on the order of $10^{17}$ at/cm$^3$. The thickness of this first waveguiding layer 8 is typically between 500 Å and 5000 Å. The active layer 10 of II–VI semiconductor material is disposed atop the first waveguiding layer. This active layer is for example a single quantum well of ZnCdSe with a thickness on the order of 65 Å. The active layer 10 can also be a multi-quantum well active layer, in which case the quantum wells are spaced apart by spacers of, for example, the same material as the waveguiding layer. These spacers typically have a thickness of between about 100 Å and 200 Å. The second waveguiding layer 12 is disposed on top of the active layer 10. This second waveguiding layer 12 is of II–VI semiconductor material of a second conductivity type, opposite to the conductivity type of the first waveguiding layer 8, for example p-type ZnSSe. The net doping concentration in this second waveguiding layer is, for example, on the order of $10^{17}$ at/cm$^3$, while the thickness is typically between 500 Å and 5000 Å.

The second cladding layer 14, of the second conductivity type, is disposed atop the second waveguiding layer 12. This second cladding layer 14 is, for example, of p-type ZnMgSSe having a net doping concentration on the order of $10^{17}$ at/cm$^3$. The thickness of the second cladding layer is typically about 1 micron. The two cladding layers 6 and 14 confine the laser light to the layers 8–12, and thus provide the transverse confinement. An electrical contact layer 16 of II–VI semiconductor material of the second conductivity type is provided on top of the second cladding layer 14. This electrical contact layer 16 is, for example, of p-type ZnSe having a net doping concentration on the order of $10^{18}$ at/cm and a thickness of 1000 Å.

On top of this structure an insulating layer 18, for example an insulating oxide layer, is disposed over part of the electrical contact layer 16. This insulating layer prevents current from flowing into the part of the II–VI semiconductor layer structure 4 underneath it, and has, for example, a thickness of 1000 Å. A sticking layer 20, such as for example a titanium layer, is provided on top of the oxide, and extends slightly beyond the insulating layer to cover an adjacent stripe of the electrical contact layer 16. The width 22 of the adjacent stripe of the electrical contact layer 16 covered by the sticking layer 20 is between about 1 micron and 10 microns. This sticking layer, which has, for example, a thickness of 100 Å, provides a base for a strained layer 24, which can be either a strained stack of films, or a strained single film. Both the sticking layer 20 and the strained layer 24 are preferably made of metal so that they can function as an electrode. The strained layer 24 typically has a thickness of between about 0.05 micron and 2 microns. It is again noted here that a separate sticking layer can be omitted if the strained layer includes a sticking layer on its bottom.

The structure of this embodiment is an called an edge structure, since the strain field in the underlying II–VI semiconductor layer structure 4 is the result of the strain induced at an edge 26 of the strained layer 24. In accordance with the photo-elastic effect the strain field in the II–VI semiconductor layer structure will cause changes in the refractive index of the material. The refractive index will increase in II–VI semiconductor regions under tension, while it will decrease in II–VI semiconductor regions under compression. Since light is guided in regions with a high refractive index, control of the changes in the effective refractive indices through control of the strain field will produce an effective refractive index profile that confines light in the lateral direction. When the strained layer is compressively strained, a lateral waveguide will be formed in the II–VI semiconductor layer structure under the strained layer 24 near the edge 26, while when the strained layer is under tension, the lateral waveguide will be formed near the edge 26 in the part of the II–VI semiconductor layer structure not covered by the strained layer 24. Since a strained layer of metal can also function to inject current into the structure, the waveguide is preferably formed under the strained layer such that the lateral waveguide is located at the spot where the laser beam is generated. The beam will thus be confined by the cladding layer 6 and 14 in the vertical direction, and by the strain-induced waveguide in the lateral direction.

The photo-elastic effect, which describes the changes of the refractive index as a function of the strain, is relatively strong in II–VI semiconductor materials when compared to the effect in other semiconductor materials. As a result, with proper control a strong strain-induced lateral confinement can be produced in II–VI semiconductor materials. The magnitude of the strain in the strained layer can be controlled by, and depends upon, factors such as the deposition technique used to deposit the layer, the temperature and the rate at which the layer is deposited, and the material selected for the layer.

A variation of this first embodiment entails ion implanting a part of the electrical contact layer, instead of providing a separate insulating layer 18 on top of the II–VI semiconductor layer structure 4. The ion implantation in parts of this electrical contact layer causes the resistance of those parts to increase, thereby confining the current flow to areas which are not ion implanted.

Figure 2:
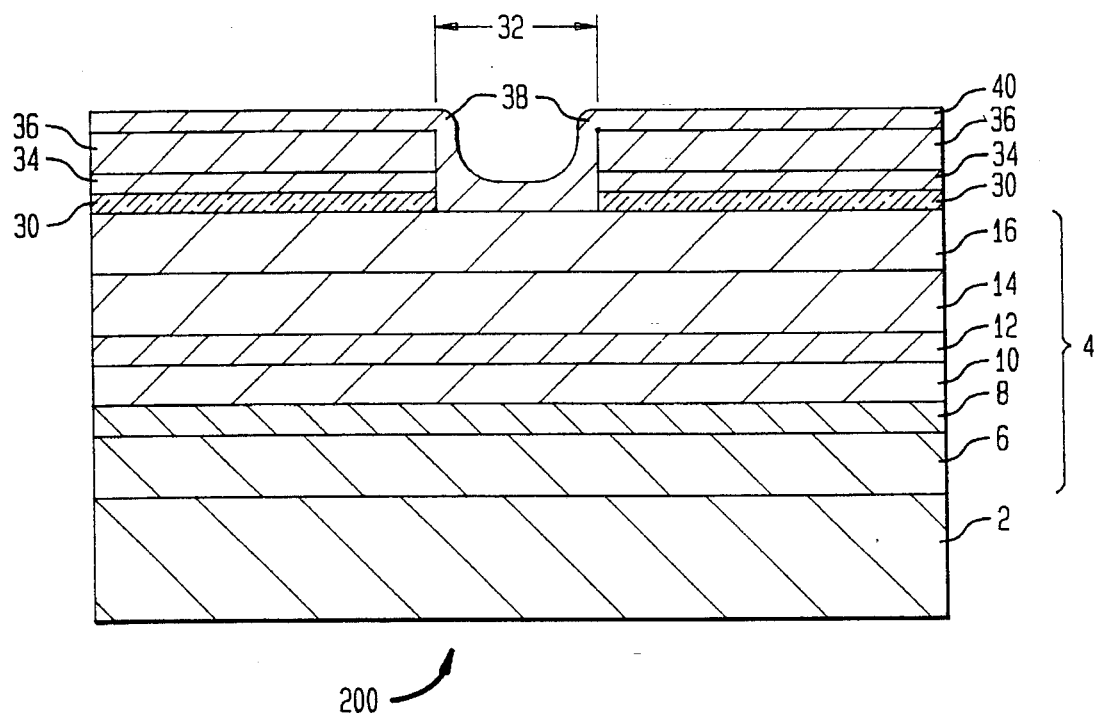
FIG. 2 is a cross-sectional view illustrating a second embodiment of a structure of a II–VI semiconductor diode laser which includes a strained layer in a window pattern in accordance with the invention.

A second embodiment of the invention is shown in FIG. 2. The substrate and the II–VI semiconductor layer structure 4, including the layers 6–16 of the II–VI semiconductor diode laser 200, are as described above with reference to FIG. 1. In this second embodiment, however, an insulating layer 30, for example an insulating oxide layer having a stripe-shaped opening (window), is provided on top of the electrical contact layer 16. The width 32 of the window in this insulating layer 30 is roughly between 1 micron and 10 microns. A sticking layer 34, such as for example a titanium layer, is provided on top of the oxide. This sticking layer 34, which forms the base for the strained layer 36, also has the window in it. The typically 0.05 micron to 2 microns thick strained layer is again either a strained stack of films, or a strained single film. In this second embodiment of the invention, the strained layer 36 has a window in it, thus forming two edges (discontinuities) 38. These two edges 38, spaced apart by substantially the window width 32, cause the strain field in the underlying II–VI semiconductor layer structure 4.

The strain field produced by the two edges will induce localized changes in the refractive index in accordance with the photo-elastic effect, producing a strain-induced waveguide. For window widths 32 between roughly 1 micron and 10 microns, as noted above, the strained layer should be under tensile strain to produce the waveguide under the center of the window. Though structures with a strain-induced waveguide under the center of the window and having a wider window than indicated here can be obtained if the strain of the strained layer is reversed, these structures provide weaker lateral confinement than the described structure.

In this second embodiment of the invention a metal electrode layer 40 is disposed over the entire structure, for example by evaporation. This metal electrode layer is made of, for example, Au or Pt. The metal electrode layer 40 extends down into the stripe-shaped opening (window) formed by the layers 30, 34, and 36 to contact the electrical contact layer 16. During operation of the laser structure the current flow between the metal electrode layer 40 and the electrical contact layer 16 will be confined to the area of the electrical contact layer not covered by the insulating layer 30.

A variation of this second embodiment is again to ion implant a part of the electrical contact layer instead of providing a separate insulating layer 30 on top of the II–VI semiconductor layer structure 4, to confine the current flow in operation.

Figure 3:
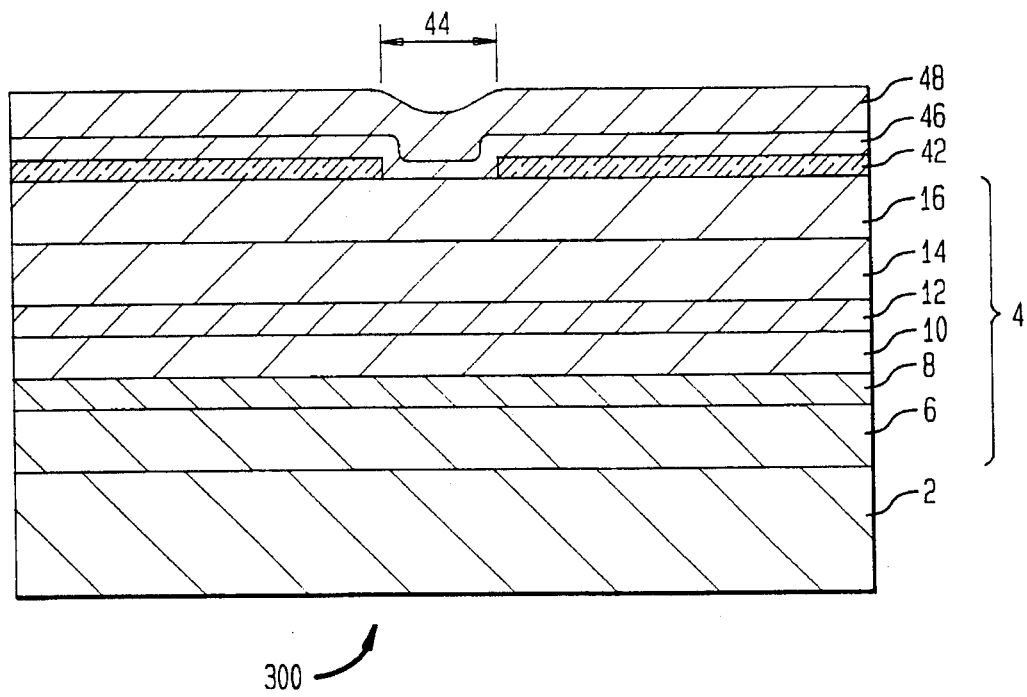
FIG. 3 is a cross-sectional view illustrating a third embodiment of a structure of a II–VI semiconductor diode laser which includes a strained layer in a stripe equivalent pattern in accordance with the invention.

A third embodiment of the invention is shown in FIG. 3. The layer structure for the layers 2–16 of the II–VI semiconductor diode laser 300 is again as described above with reference to FIG. 1. In this third embodiment, however, a mechanically-soft insulating layer 42, for example an insulating polyimid layer, is provided on top of the electrical contact layer 16. This mechanically-soft insulating layer 42 has a stripe-shaped opening (window) through it, the width 44 of which is roughly between 1 micron and 10 microns. A sticking layer 46, such as for example a titanium layer, is provided on top of the entire structure, and thus covers the mechanically-soft insulating layer 42 and the exposed part of the electrical contact layer 16. A strained layer 48 is deposited on top of this sticking layer, the strained layer being either a strained stack of films, or a strained single film. The thickness of this strained layer is typically between 0.05 micron and 2 microns. The sticking layer and strained layer in this embodiment are preferably made of metal such that they can function as an electrode. The strained layer 48 covers the entire structure, and thus does not have the discontinuities of the first and the second embodiment. However, the mechanically-soft insulating layer 42, in addition to confining the current flow to the window, also mechanically insulates the underlying II–VI semiconductor layer structure from the strained layer 48. As a result, the strain field introduced by the strained layer 48 is similar to that of a strained stripe the width of the window. The strain field produced by the stripe-equivalent strained layer in this embodiment will induce localized changes in the refractive index in accordance with the photo-elastic effect, producing a strain-induced waveguide. For window widths 44 between roughly 1 micron and 10 microns as given above, the strained layer in this embodiment should be under compressive strain to produce the waveguide under the center of the window.

Though structures with a strain-induced waveguide under the center of the window having a wider window than indicated here can be obtained if the strain of the strained layer is reversed, these structures provide weaker lateral confinement than the described structure. It is furthermore noted that a window in a film under tension induces the same refractive index profile as a stripe, having the width of the window, under compression.

Figure 4:
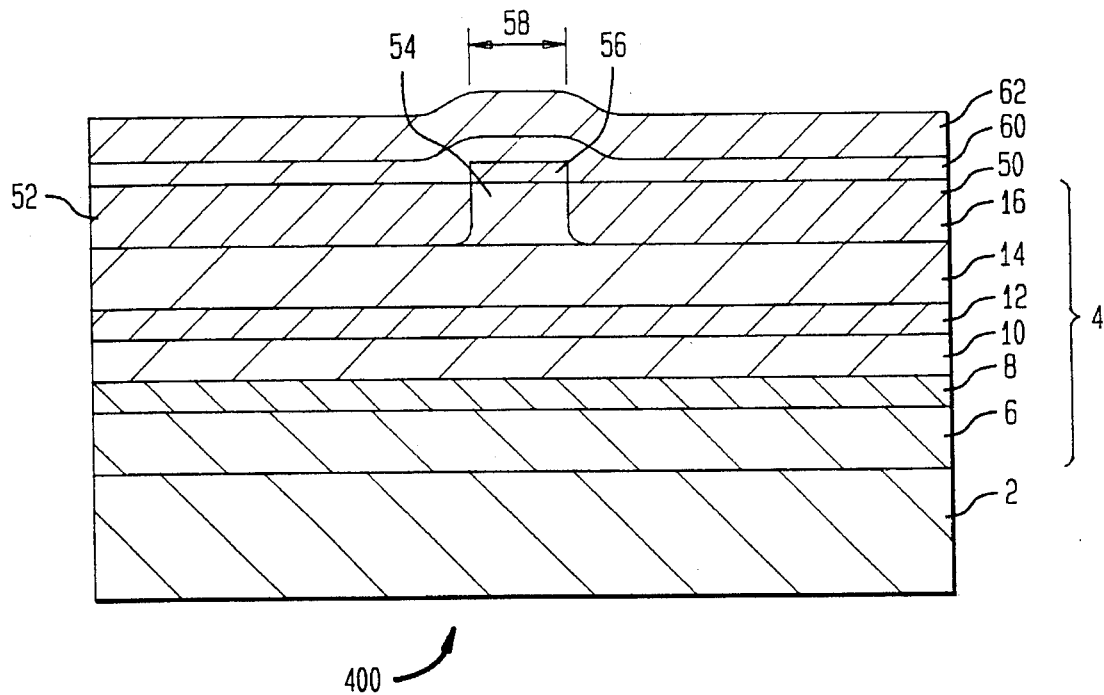
FIG. 4 is a cross-sectional view illustrating a further embodiment of a structure of a II–VI semiconductor diode laser which includes a strained layer in a window equivalent pattern in accordance with the invention.

A further embodiment of the invention is shown in FIG. 4. The layer structure for the layers 2–16 of the II–VI semiconductor diode laser 400 is again as described above with reference to FIG. 1. In this further embodiment, however, two regions 50, 52 of the electrical contact layer 16 are ion implanted. These ion-implanted regions have a high resistivity and thereby confine the current flow in operation to the nonimplanted area 54 of the electrical contact layer 16. A mechanically-soft metal contact stripe 56, for example a gold contact stripe, is provided on top of the nonimplanted area 54 of the electrical contact layer 16. Preferably, however, the contact stripe 56 is first disposed on the electrical contact layer 16, and will subsequently function as a mask for the ion implantation of the electrical contact layer 16. The width 58 of this contact stripe can be roughly between 1 micron and 10 microns, while its thickness can be, for example 2000 Å. A sticking layer 60, preferably made of metal, for example titanium, is provided on top of the entire structure. A strained layer 62 is deposited over the sticking layer 60. This strained layer 62, which again is either a strained stack of films or a single strained film, is preferably made of metal, and has a total thickness typically between 0.05 micron and 2 microns.

The strain field that is produced in the II–VI semiconductor layer structure 4 by the strained layer is similar to the strain field that would be produced by a strained layer with a window in it as described above with reference to the second embodiment, since the mechanically-soft metal contact stripe 56 mechanically insulates the underlying II–VI semiconductor structure from the portion of the strained layer 62 above the contact stripe.

Figure 5:
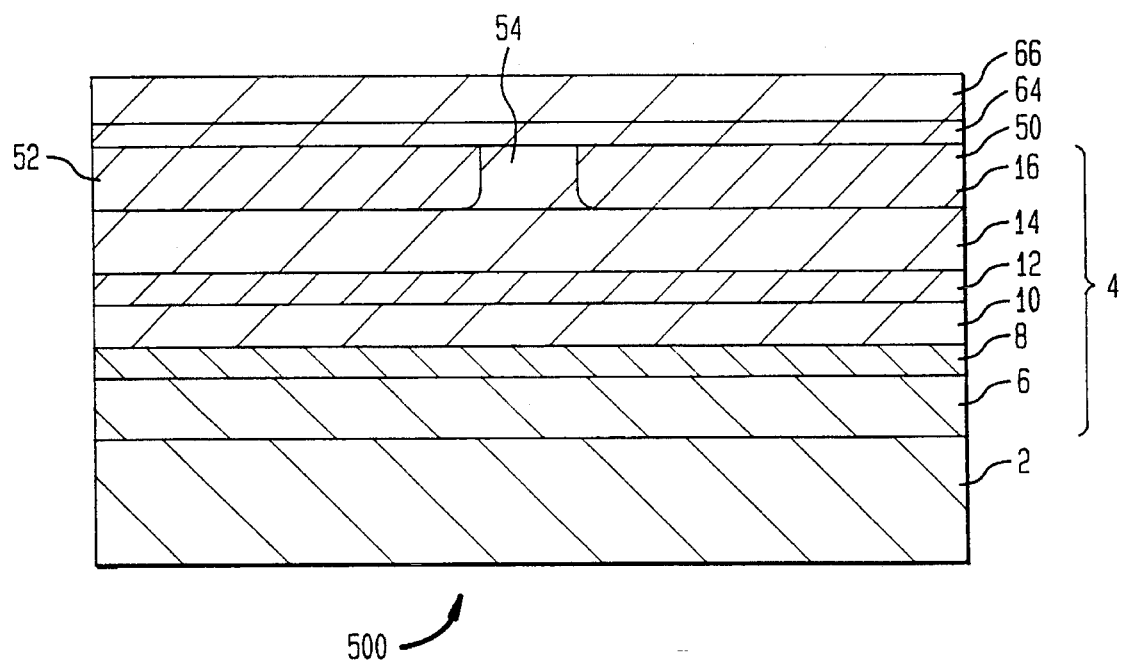
FIG. 5 is a cross-sectional view illustrating yet a further embodiment of a structure of a II–VI semiconductor diode laser which includes a strained layer in accordance with the invention.

Yet a further embodiment of the invention is shown in FIG. 5. The layer structure for the layers 2–16 of the II–VI semiconductor diode laser 500 is again as described above with reference to FIG. 1. In this embodiment, however, two regions 50, 52 of the electrical contact layer 16 are ion implanted, as was done in the embodiment in FIG. 4. These ion-implanted regions have a high resistivity and thus confine the current flow in operation to the nonimplanted area 54 of the electrical contact layer 16. A sticking layer 64, preferably made of metal, for example titanium, is provided on top of the entire structure. A strained layer 66 is deposited over the sticking layer 64. This strained layer 66, which again is either a strained stack of films or a single strained film, is preferably made of metal, and has a total thickness typically between 0.05 micron and 2 microns.

The strained layer in this embodiment produces a laterally-uniform strain field in the II–VI semiconductor layer structure, similar to the field produced by bending the laser structure. Because of the absence of lateral spatial variations in the strain field in the II–VI semiconductor layer structure, no strain-induced lateral waveguide is produced in this embodiment. When the strained layer in this embodiment is tensely strained, it will cause enhanced gain of the active layer 10. This strain-enhanced gain allows for lower operating currents, thereby increasing laser life and decreasing power consumption.

In summary, the present invention provides a II–VI semiconductor diode laser having a strained layer, which is either a single film or a stack of films, patterned in some form, on top of a II–VI semiconductor layer structure. In the embodiments depicted in FIGS. 1–4 this strained layer produces a nonuniform strain field in the layer structure, which induces localized changes in the refractive index of the II–VI semiconductor layer structure 4 and results in a strain-induced waveguide. In the embodiment depicted in FIG. 5 the strained layer provides for a strain field, similar to the strain in the structure when it is bent. A tensely-strained layer in this embodiment induces strain-enhanced gain, allowing for lower threshold currents in the operation of the laser.

The present invention is not limited to the embodiments shown, since many modifications and variations are possible to those skilled in the art within the scope of the invention. Thus different thicknesses, net doping levels, different II–VI semiconductor materials for the II–VI layers in the semiconductor diode laser, or different materials for the substrate may be used. For example in the case of an active layer of ZnSe, ZnMgSSe can be used for the waveguiding and the cladding layers. In that case the composition of ZnMgSSe in the respective layers should be such that the band gap of the waveguiding layers is smaller than the band gap of the cladding layers. In case of an active layer of ZnCdSe, ZnSe could also be used as the material for the waveguiding layers, with ZnSSe as the material for the cladding layers.

It will also be clear that the conductivity types in the above embodiments may all be reversed simultaneously without departing from the spirit or scope of the invention.

Additionally, the present invention is not limited to the shown layer structure. For example, separate waveguiding layers can be omitted around the active layer 10, resulting in a double heterostructure (DH) laser, without departing from the spirit or scope of the invention. This structure is for example possible in semiconductor diode lasers having a multi-quantum-well active layer of ZnCdSe and ZnSSe cladding layers, or lasers having a single-quantum-well ZnSe active layer having a thickness greater than 200 Å and ZnMgSSe cladding layers. It is further noted that if the substrate is of the same semiconductor material as the first cladding layer, the substrate may at the same time act as the first cladding layer, thereby eliminating the need for a separate first cladding layer, such as for example in II–VI semiconductor diode lasers having a multi-layer active layer ZnCdSe and cladding layers of ZnSe on a substrate of the same material.

What is claimed is:

1. A II–VI semiconductor diode laser comprising:
   a substrate;
   a II–VI semiconductor layer structure disposed atop the substrate and including a II–VI semiconductor active layer and a II–VI semiconductor electrical contact layer disposed over the II–VI semiconductor active layer; and
   a strained layer disposed over the II–VI semiconductor layer structure.

2. A II–VI semiconductor diode laser as claimed in claim 1, further comprising an insulating layer between said strained layer and said II–VI semiconductor layer structure, said insulating layer covering part of said II–VI semiconductor layer structure.

3. A II–VI semiconductor diode laser as claimed in claim 2, wherein said strained layer contacts a stripe of said II–VI semiconductor layer structure adjacent the insulating layer.

4. A II–VI semiconductor diode laser as claimed in claim 2, wherein said insulating layer has a stripe-shaped opening therethrough, and said strained layer covers said insulating layer.

5. A II–VI semiconductor diode laser as claimed in claim 2, wherein said insulating layer is a mechanically-soft insulating layer having a stripe-shaped opening therethrough exposing a stripe of said II–VI semiconductor layer structure, and said strained layer covers said insulating layer and said stripe of said II–VI semiconductor layer structure exposed through said stripe-shaped opening in said insulating layer.

6. A II–VI semiconductor diode laser as claimed in claim 5, wherein said mechanically-soft insulating layer is a polyimid layer.

7. A II–VI semiconductor diode laser as claimed in claim 1, wherein said electrical contact layer includes an ion-implanted electrically-insulating region, and said strained layer covers said insulating region and an adjacent stripe of said electrical contact layer.

8. A II–VI semiconductor diode laser as claimed in claim 1, wherein said electrical contact layer is at least partly ion implanted, except for a stripe-shaped area.

9. A II–VI semiconductor diode laser as claimed in claim 8, wherein said strained layer covers the II–VI semiconductor laser structure.

10. A II–VI semiconductor diode laser as claimed in claim 8, further comprising a mechanically-soft metal contact stripe contacting the stripe-shaped area of the electrical contact layer.

11. A II–VI semiconductor diode laser as claimed in claim 10, wherein said strained layer covers said electrical contact layer and said mechanically-soft metal contact stripe.

12. A II–VI semiconductor diode laser as claimed in claim 1, wherein said II–VI semiconductor layer structure further comprises a first and a second II–VI semiconductor cladding layer, said first and said second cladding layers being on opposite sides of said active layer.

13. A II–VI semiconductor diode laser as claimed in claim 12, wherein said II–VI semiconductor layer structure further comprises a first and a second waveguiding layer, said first waveguiding layer being disposed between said first cladding layer and said active layer, and said second waveguiding layer being disposed between said second cladding layer and the active layer.

14. A II–VI semiconductor diode laser as claimed in claim 1, wherein said strained layer comprises a single film.

15. A II–VI semiconductor diode laser as claimed in claim 1, wherein said strained layer comprises a stack of films.

16. A II–VI semiconductor diode laser as claimed in claim 1, wherein said strained layer comprises a metal.

17. A II–VI semiconductor diode laser as claimed in claim 1, wherein said strained layer comprises a sticking layer.

* * * * *